United States Patent [19]

Davey

[11] 3,950,586

[45] Apr. 13, 1976

[54] ELECTRICAL INSULATOR MATERIALS FOR USE IN MICRO-CIRCUIT CONSTRUCTION

[75] Inventor: Norman Davey, Newbury, England

[73] Assignee: National Research Development Corporation, London, England

[22] Filed: Dec. 12, 1973

[21] Appl. No.: 424,048

Related U.S. Application Data

[63] Continuation of Ser. No. 189,791, Oct. 15, 1971, abandoned, which is a continuation of Ser. No. 775,404, Nov. 13, 1968, abandoned.

[30] Foreign Application Priority Data

Nov. 17, 1967 United Kingdom............... 52519/67

[52] U.S. Cl. .................... 428/195; 427/79; 427/96; 428/323; 428/539; 317/258
[51] Int. Cl.² ...................... B05D 5/12; B32B 3/10
[58] Field of Search ........... 117/217, 212, 219, 227, 117/229, 222, 221, 224; 161/193, 196; 317/258; 427/79, 96, 58, 126; 428/195, 323, 539

[56] References Cited
UNITED STATES PATENTS

| | | | |
|---|---|---|---|
| 3,086,150 | 4/1963 | Held | 317/258 |
| 3,267,342 | 8/1966 | Pratt, Jr. et al. | 317/258 |
| 3,379,943 | 4/1968 | Breedlove | 317/258 |
| 3,549,415 | 12/1970 | Capek et al. | 117/217 |
| 3,582,729 | 6/1971 | Girard et al. | 117/217 |
| 3,609,482 | 9/1971 | Edelman | 117/217 |
| 3,649,353 | 3/1972 | Ulrich | 117/212 |
| 3,649,891 | 3/1972 | Lawless | 317/258 |
| 3,673,092 | 6/1972 | Dietz | 317/258 |

Primary Examiner—Cameron K. Weiffenbach
Attorney, Agent, or Firm—Cushman, Darby & Cushman

[57] ABSTRACT

Insulator material for microcircuit construction comprising a glaze composition intermixed with a proportion of refractory oxide particles sufficient to make the fluidity of the material considerably less than the fluidity of the glaze composition by itself, at temperatures just sufficient to fuse the glaze. The particles are preferably of an oxide which will gradually diffuse, but not melt, into the glaze, and will tend to raise the glaze fusion temperature during heat treatments in which the glaze is fused. Alumina, beryllia, titania, zirconia, calcium oxide or magnesium oxide may be used, preferably in proportions from 10 to 40 per cent by weight, and with particle sizes in the range from 2 to 30 microns. The material may be sprayed or screen-printed in a suitable medium. Successive layers may be applied and heat-treated at temperatures sufficient to fuse the glaze of the top layer without distorting underlayers previously fused at the same temperature.

21 Claims, 1 Drawing Figure

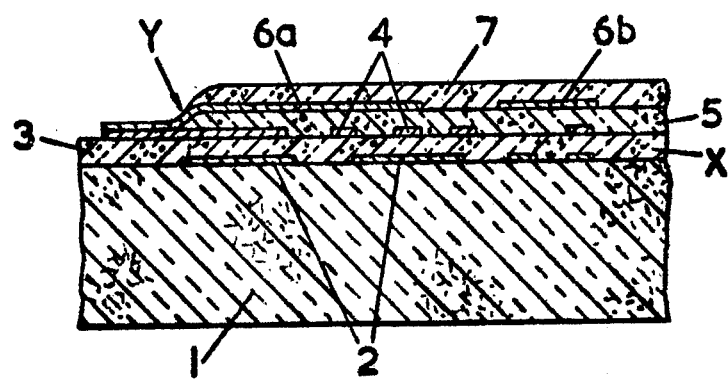

ELECTRICAL INSULATOR MATERIALS FOR USE IN MICRO-CIRCUIT CONSTRUCTION

This is a continuation of application Ser. No. 189,791 filed Oct. 15, 1971, now abandoned, and which is a Rule 60 continuation of Ser. No. 775,404, filed Nov. 13, 1968 now abandoned.

BACKGROUND OF THE INVENTION

The present invention relates to methods and materials for the fabrication of micro-electronic circuits and particularly to the fabrication of insulating layers therein. It is particularly advantageous in the fabrication of multi-layer micro-electronic circuits.

Multi-layer micro-electronic circuits are built up on insulating substrates by superimposing printed conductive ink patterns and layers of insulating material. The layers of insulating material are usually glaze compositions, that is to say powdered glasses or mixtures of powdered glasses, and may be deposited in a suitable binder or medium, for instance by spraying or spinning processes. The binder is evaporated or decomposed into volatile products which are driven off, and the glaze subsequently fused by heating.

There are many requirements to be satisfied in the choice of a suitable glaze composition. The glaze must be chemically compatible with the surface on which it is to be deposited, so as to provide a strongly adherent and reliable bond. It must be physically compatible, having similar thermal expansion properties to the substrate and not too low a thermal conductivity, so as to resist thermal shock in manufacture and use. It must have a high electrical resistivity, preferably greater than $10^{11}$ ohms per square, to avoid short-circuiting and deleterious capacitive coupling effects on the circuit. It should also have a sufficiently high thermal conductivity to allow for the dissipation of heat from the microcircuit without the development of excessive temperatures or temperature gradients. It must be fusible at a convenient temperature not likely to damage or distort any previously deposited parts of the circuit, so as to form a reliable, continuous, non-porous, stable and adherent insulating layer.

When several layers of conductive networks are required they must be separated by insulating layers, and it is clearly necessary to fuse each insulating layer without causing any flow or distortion in previously deposited layers; for this reason it has generally been considered necessary to develop and use a series of mutually compatible metallic inks and glaze compositions having progressively lower fusion temperatures, in order to make multilayer circuits. In order to allow a convenient tolerance on the temperatures of successive heat-treatments, and to ensure that fusion of each layer could be achieved without distortion of the preceding layer, it was considered desirable that there should preferably be a temperature difference of at least 150°C. or more between any pair of consecutive heat-treatments.

For reasons of convenience, expense, and safety, and also to avoid the decomposition of some constituents of the glaze compositions, it is preferable to use only materials which can be heated to fusion temperatures in an oxidising atmosphere, for instance air. This restricts the choice of metals usable for printing the conductive patterns.

In view of all these restrictions, it will be readily understood that it is difficult to find an ideal series of materials to facilitate the fabrication of microelectronic circuits of more than a few layers. The use of a series of different materials, and the requirement for heat treatments at a plurality of accurately controlled temperatures, are experimentally and commercially inconvenient. The use of materials which do not quite satisfy all the requirements, or inaccuracies in the temperature controls tend to reduce the yield of satisfactory circuits.

DETAILED DESCRIPTION OF THE INVENTION

According to the present invention there is provided an insulator material for fabricating microelectronic circuits, including a glaze composition intermixed with a proportion of particles of a refractory oxide sufficient to make the fluidity of the material considerably less than the fluidity of the glaze composition by itself, over a range of temperature extending from the temperature at which fusion of the glaze composition begins towards higher temperatures.

The particles are preferably of an oxide which will gradually diffuse, but not melt, into the glaze composition when it is melted and will thereby tend to raise the fusion temperature of the glaze composition during prolonged or successive heat treatments at temperatures sufficient to cause fusion of the glaze composition.

The refractory oxide particles may include one or more of the oxides alumina, beryllia, titania, zirconia, calcium oxide or magnesium oxide of natural or synthetic origin, and may preferably constitute from ten to forty per cent by weight of the insulator material.

By using an insulating material of this kind, it is possible to fabricate multilayer microcircuits using the same material for all the insulating layers, and using the same nominal temperature (plus or minus a reasonable tolerance) for the heat treatments of all of the layers.

The presence of solid oxide particles restricts the fluidity of the material so that the glaze composition can be fused without excessive spreading, and hence makes it much easier to establish a fused layer of insulating material over a sharply defined area. Indeed with such material it is possible to form and fuse insulating layers having small apertures at chosen locations, through which electrical connections can be made. Its use may therefore be advantageous even where only one insulating layer is required. When the material is used in a process requiring prolonged or successive heat treatments, such as the fabrication of a multilayer circuit, diffusion of the refractory oxide into the glaze composition gradually raises its fusion temperature so that layers previously heated become more stable and resistant to flow at the heat-treatment temperature as the heat-treatment continues. Preferably each layer deposited is dried and then fused by heat-treatment at a temperature just sufficient to cause fusion of the original glaze composition, before the next layer is deposited. In this way each newly added layer can be fused while the previously deposited layers have been substantially stabilized by the preceding heat treatments. In particular the bonds between the first insulating layer and the substrate are highly stabilized and strengthened.

The glaze composition used may be made of any glass or mixture of glasses which is compatible with the oxide particles used, and on which the diffusion of the oxide will act as hereinbefore described. For instance, the glaze composition may be formed from powdered glassy compositions of oxides of calcium, boron and aluminum, or oxides of lead, calcium and aluminum, or oxides of titanium, calcium and aluminum, or oxides of barium, boron, aluminum and silicon, or oxides of lead, zirconium and silicon; or lead aluminoborate glasses, lead borosilicate glasses, sodium borosilicate glasses, sodium lead silicate glasses or titania glasses. Compositions having a fusion temperature in the range from about 600° to about 1300°C. are preferred, for the sake of compatibility with known metallic conductor inks.

The insulator material may be mixed with a suitable organic carrier liquid and applied to the circuit by conventional processes, such as screen-printing, spraying or spinning for instance, and if it is desired to restrict the insulation to a sharply defined area, this may be done either by a conventional in-situ masking technique, or by using an appropriate stencil pattern in the screen-printing process. The particles of glaze and oxide must of course be sufficiently fine to pass through the spraying equipment or through the mesh screen of the screen-printing process, if these methods are to be used. They may have diameters in the range from 2 to 30 microns.

As hereinbefore noted, the proportion of oxide particles used is preferably in the range from 10 to 40 percent by weight. Obviously very small proportions of the oxide particles may be not sufficiently effective to allow a reasonable tolerance on the heat-treatment temperatures. Low proportions of the oxide particles may be required where low fusion temperatures are desired. High proportions of oxide particles may undesirably increase the fusion temperature.

If the oxide particles are produced by a percussion mill, they may be more angular than similar particles formed in a ball mill, and may be effective in lower concentrations than are appropriate with ball-milled particles.

The use of titania instead of alumina increases the dielectric constant of the insulation, which may be useful in fabricating capacitors but is a disadvantage for network insulators and crossovers. The use of beryllia should tend to increase the thermal conductivity of the insulation, but it has the disadvantage of high toxicity.

DESCRIPTION OF THE PREFERRED EMBODIMENTS

An embodiment of the invention will now be illustrated, by way of example only, with reference to the accompanying drawing which is an enlarged diagrammatic cross-section of part of a three-layer microcircuit, not drawn to scale.

This drawing shows the following features in cross-section: an alumina substrate 1, on which the circuit is formed; a first pattern of metallic conductors 2, formed on the surface of the substrate 1, dried and heated in air to a temperature just sufficient to consolidate the metallic particles in the ink used, a first insulating layer 3, formed by screen-printing a mixture of oxide particles, glaze particles and carrier liquid, drying the deposit and heating the assembly in air to a temperature just sufficient to cause fusion of the glaze particles, a second pattern of metallic conductors 4, formed by screen printing and subsequent drying and heat treatment similarly to the pattern 2 and of the same material, a second insulating layer 5, formed by screen printing and subsequent drying and heat treatment similarly to the layer 3 and of the same material, a third pattern of metallic conductors 6a, 6b formed similarly to the conductors 2 and 4, and a third insulating layer 7, formed similarly to the layers 3 and 5.

The metal used to form the conductors 2, 4, and 6 should have a fusion temperature not greatly exceeding the fusion temperature of the glaze particles used in the material for the insulating layers 3, 5 and 7. The thickness of the deposits formed will depend mainly on the fineness of the mesh screen used for the screen printing process. The insulating layers may be about one thousandth of an inch thick, and the oxide particles and the glaze particles may have diameters in the range from 2 to 20 mircons. A few typcial oxide particles are shown at X in layer 3; it will be realized that oxide particles are in fact distributed evenly throughout the layers 3, 5 and 7, though they are only shown in the drawing at X by way of example. The insulating layers 5 and 7 are deposited through a screen stencil pattern defining a sharp edge to the layers at Y. When the layer is fused, the presence of the oxide particles, constituting approximately 20 percent by weight of the insulator material mixture, restricts the fluidity of the glaze so that the sharply defined edge at Y will be maintained if the temperature of the heat treatment is reasonably accurately controlled. The conductor 6a overlaps the edge at Y and contacts one of the conductors 4.

Embodiments of the invention will be further illustrated by means of examples thereof set out in Table 1 hereinafter. These examples were constructed as test pieces including three insulator layers and four sets of conductor lines, deposited alternately substantially as hereinbefore described. Each set of conductors comprised ten parallel lines each about one hundredth of an inch wide, alternate sets being directed orthogonally to each other so as to form a plurality of crossovers insulated by one of the insulating layers. The conductors were formed by screen printing with commercially available metallic inks. The insulating materials were mixed with screening medium N485 (supplied by Blythe Colours Ltd.) to a suitable consistency, screen-printed, dried, and heat-treated as indicated in the table. After the final heat treatment, the samples were examined and tested and no short-circuited crossovers were found. Each heat-treatment involved drying at about 150°C. followed by about 15 minutes heating, 15 minutes or a time stated in the table at the temperature specified in the table, and about 15 minutes cooling. Examples Nos. 1 to 8 inclusive were fabricated on alumina substrates, and had conductor lines formed of a gold metallizing paste known as Hanovia Paste Colo No. 8637, supplied by Engelhard Industries Ltd. The proportion of oxide particles used in each case is specified in column two of the table as a percentage by weight of the oxide plus glass mixture, e.g., the insulator material in example 1 comprised 20% alumina, 80% borosilicate powder (mixed with the medium which is driven off by the heating process).

| Example No. | Oxide, proportion, particle size | Glaze Composition | Fusion Treatments degrees Centigrade |
|---|---|---|---|
| 1 | Alumina, 20%, <2 | Blythe 1362C (sodium borosilicate | 850 |

-continued

| Example No. | Oxide, proportion, particle size | Glaze Composition | Fusion Treatments degrees Centigrade |
|---|---|---|---|
| | microns | glaze) | |
| 2 | Alumina, 30%, <20 microns | Ramsden 1263F (lead borosilicate glaze) | 900 |
| 3 | Alumina, 30% <20 microns | Blythe 1595 (titania glaze) | 800–850 (for 30 minutes) |
| 4 | Alumina, 10% <20 microns | Glass powder made from 2CaO +9B$_2$O$_3$ + Al$_2$O$_3$ mixture | 1000 |
| 5 | Titania, 25% <10 microns | Blythe 1362C (sodium borosilicate) | 850 |
| 6 | Titania, 25% <10 microns | Ramsden 1263F (lead borosilicate) | 820 |
| 7 | Titania, 25% <10 microns | Blythe 1595 (titania glaze) | 880 |
| 8 | Alumina, 10% <20 microns | Ramsden 1169 (PbO + ZrO$_2$ + SiO$_2$ glaze) | 800 |

Glazes marked "Blythe" were obtained from Blythe Colours Ltd. Glazes marked "Ramsden" were obtained from C. E. Ramsden Ltd., Fenton, Stoke-on-Trent, England.

I claim:

1. A multi-layer microelectronic circuit which comprises a substrate, at least one pattern of metallic conductors on said substrate, a plurality of layers of insulator material with at least one pattern of metallic conductors each sandwiched between successive layers of insulator material, said insulator material consisting essentially of a glaze composition selected from the group of powdered, glassy compositions consisting of (a) oxides of calcium, boron and aluminum, (b) oxides of lead, calcium and aluminum, (c) oxides of titanium, calcium and aluminum, (d) oxides of barium, boron, aluminum and silicon, (e) oxides of lead, zirconium and silicon, (f) lead aluminoborate glasses, (g) lead borosilicate glasses, (h) sodium borosilicate glasses, (i) sodium lead silicate glasses and (j) titania glasses, wherein said glaze has a fusion temperature in the range of about 600° to about 1300° C and contains from about 10 to about 40% by weight of refactory oxide particles of diameter in the range of about 2 to about 30 microns, said refractory oxide selected from the group consisting of alumina, beryllia, titania, zirconia, calcium oxide and magnesium oxide.

2. A microelectronic circuit as claimed in claim 1 which includes at least two patterns of metallic conductors sandwiched between successive layers of insulator material.

3. A microelectronic circuit as claimed in claim 1 wherein the glaze composition is sodium borosilicate glaze and the refractory oxide is aluminum oxide.

4. A microelectronic circuit as claimed in claim 1 wherein the glaze composition is a lead borosilicate glaze and the refractory oxide is aluminum oxide.

5. A microelectronic circuit as claimed in claim 1 wherein the glaze composition is sodium borosilicate glaze and contains about 20% by weight of aluminum oxide of about 2 microns diameter particle size.

6. A microelectronic circuit as claimed in claim 1 wherein the glaze composition is lead borosilicate glaze and contains about 30% by weight of aluminum oxide of about 20 microns diameter particle size.

7. A microelectronic circuit as claimed in claim 1 wherein the glaze composition is glaze formed from oxides of calcium, boron and aluminum and contains about 10% by weight of aluminum oxide of about 20 microns diameter particle size.

8. A microelectronic circuit as claimed in claim 1 wherein the glaze composition is sodium borosilicate glaze and contains about 25% by weight of titania of about 10 microns diameter particle size.

9. A microelectronic circuit as claimed in claim 1 wherein the glaze composition is lead borosilicate glaze and contains about 25% by weight of titania of about 10 microns diameter particle size.

10. A microelectronic circuit as claimed in claim 1 wherein the glaze composition is glaze formed from oxides of lead zirconium and silicon and contains about 10% by weight of alumina of about 20 microns diameter particle size.

11. A method of forming a multi-layer microelectronic circuit including the steps of (1) forming a pattern of metallic conductors upon a substrate, (2) screen-printing through a patterned stencil screen onto the substrate and pattern of electrical conductors, a mixture comprising an organic carrier liquid and an insulating material which consist essentially of a glaze composition selected from the group consisting of powdered, glassy compositions formed from oxides of calcium, boron and aluminum; oxides of lead, calcium and aluminum; oxides of titanium, calcium and aluminum; oxides of barium, boron, aluminum and silicon; oxides of lead, zirconium and silicon; lead aluminoborate glasses; lead borosilicate glasses; sodium borosilicate glasses; sodium lead silicate glasses and titania glasses, said glaze composition having a fusion temperature in the range of about 600° to about 1300° C and containing from about 10 to about 40% by weight of refractory oxide particles of diameter in the range of about 2 to 30 microns such that the amount of said refractory oxide particles is sufficient to reduce the fluidity of the glass component of said glaze composition, said refractory oxide selected from the group consisting of alumina, beryllia, titania, zirconia, calcium oxide and magnesium oxide, (3) removing the organic carrier liquid by evaporation, (4) heating the assembly to a temperature sufficient to cause fusion of the glass component of the glaze composition while said refractory oxide particles gradually diffuse into the glaze at said fusion temperature, without causing substantial flowing of said glaze, and allowing the fused glaze composition to cool, (5) forming a pattern of metallic conductors upon the surface of the insulating material formed in step (4), (6) applying a layer of insulating material as defined in steps (2) to (4) above and repeating steps (5) and (6) so that a microelectronic circuit having a plurality of layers is produced, each fusion of the glazed composition being carried out at essentially the same temperature.

12. A method of forming a microelectronic circuit upon a substrate including the steps of: (1) forming a pattern of metallic conductors upon a substrate, (2) screen-printing through a patterned stencil screen onto the substrate and pattern of electrical conductors, a mixture comprising an organic carrier liquid and an insulating material which consists essentially of a glaze composition selected from the group consisting of powdered, glassy compositions formed from oxides of calcium, boron and aluminum; oxides of lead, calcium and aluminum; oxides of titanium, calcium and aluminum; oxides of barium, boron, aluminum and silicon; oxides of lead, zirconium and silicon; lead aluminoborate glasses; lead borosilicate glasses; sodium boronsilicate glasses; sodium lead silicate glasses and titania glasses, said glaze composition having a fusion temperature in the range of about 600° to about 1300° C and containing from about 10 to about 40% by weight of refractory oxide particles in the range of about 2 to about 30 microns such that the amount of said refractory oxide particles is sufficient to reduce the fluidity of the glass component of said glaze composition, said refractory oxide selected from the group consisting of alumina, beryllia, titania, zirconia, calcium oxide and magnesium oxide, (3) removing the organic carrier liquid by evaporation, (4) heating the assembly to a temperature sufficient to cause fusion of the glass component of the glaze composition while said refractory oxide particles gradually diffuse into the glaze at said fusion temperature, and allowing the fused glaze to cool, (5) forming a pattern of metallic conductors upon the surface of the fused insulating material formed in step (4), (6) applying a layer of insulating material as defined in steps (2) to (4) above, whereby a microelectronic circuit having two layers is produced.

13. A method as claimed in claim 12 wherein the glaze composition is sodium borosilicate glaze and the refractory oxide is aluminum oxide.

14. A method as claimed in claim 12 wherein the glaze composition is a lead borosilicate glaze and the refractory oxide is aluminum oxide.

15. A method for forming a multi-layer microelectronic circuit on a substrate including (a) forming a plurality of spaced apart conductor patterns on said substrate and interconnecting said conductor patterns, (b) establishing an insulator layer between successive patterns, (c) heating the insulator layer to fluidize the insulator material and form a fused layer and (d) allowing the circuit assembly to cool; the arrangement being such that the patterns (a) and layer (b) are superimposed, the insulator material being composed of a glaze intermixed with refractory oxide particles capable of raising the glaze working temperature on dissolving therein which particles gradually diffuse, but not melt, into the glaze composition and present in amount such that on heating at a temperature higher than the minimum working temperature of the glaze and in the range 600° to 1300° C, the working temperature of the glaze is progressively raised towards that higher temperature.

16. A method as claimed in claim 15 wherein each insulating layer is formed with a substantially flat upper surface and in which the forming of said conductor patterns and the establishing of said insulator layer comprises laying down conductor deposits and screen-printing, sequentially, deposits of a paste consisting of said insulating material mixed with an organic carrier liquid, the paste deposits alternating with the conductor deposits.

17. A method as claimed in claim 16 in which the conductor deposits are laid down by screen-printing.

18. A method as claimed in claim 16 wherein the refractory oxide is alumina, beryllia, titania, zirconia, calcium oxide or magnesium oxide.

19. A method as claimed in claim 16 wherein the refractory oxide constitutes from 10 to 40% by weight of the insulating material.

20. A method as claimed in claim 16 wherein the particulate refractory oxide has a particle size in the range of 2 to 30 microns.

21. A method as claimed in claim 16 wherein the insulator material consists initially of a powdered glaze and about 10 to 40% by weight of alumina of particle size in the range 2 to 30 microns.

* * * * *